United States Patent [19]

Choi et al.

[11] Patent Number: 5,441,766
[45] Date of Patent: Aug. 15, 1995

[54] METHOD FOR THE PRODUCTION OF HIGHLY PURE COPPER THIN FILMS BY CHEMICAL VAPOR DEPOSITION

[75] Inventors: Hyung S. Choi; Young S. Cho; Chong J. Lim; Soon T. Hwang, all of Seoul, Rep. of Korea

[73] Assignee: Korea Institute of Science and Technology, Seoul, Rep. of Korea

[21] Appl. No.: 295,423

[22] Filed: Aug. 25, 1994

[51] Int. Cl.$^6$ ............................................. C23C 16/18
[52] U.S. Cl. .................................. 427/250; 427/124; 427/123; 427/314
[58] Field of Search ................. 427/250, 124, 123, 314

[56] References Cited

U.S. PATENT DOCUMENTS 3,356,527 12/1967 Moshier et al.
4,442,138 4/1984 Bich et al. ............................ 427/116
5,358,743 10/1994 Hampden-Smith et al. ........ 427/282

OTHER PUBLICATIONS

Chem. Mater., vol. 4, No. 3, 1992, pp. 577–582, R. Kumar, et al., "Copper (I) Precursors For Chemical Vapor Deposition Of Copper Metal".

Chem. Mater., vol. 4, No. 4, 1992, pp. 788–795, H. K. Shin, et al., "Hot-Wall Chemical Vapor Deposition Of Copper From Copper (I) Beta-Diketonate Compounds, (Beta-Diketonate) CuLn, Via Thermally Induced Disproportionation Reactions".

*Primary Examiner*—Roy V. King
*Attorney, Agent, or Firm*—Oblon, Spivak, McClelland, Maier & Neustadt

[57] ABSTRACT

The present invention relates to a method for the production of highly pure copper thin films free from carbonaceous impurities, which comprises depositing a thin copper film using an organic copper compound precursor containing ketoesters alone or in combination with a Lewis base as ligands, by which the ligands are not thermally decomposed during the vapor deposition.

6 Claims, No Drawings

METHOD FOR THE PRODUCTION OF HIGHLY PURE COPPER THIN FILMS BY CHEMICAL VAPOR DEPOSITION

BACKGROUND OF THE INVENTION

1. Field of the Invention

The present invention relates to a method for the production of highly pure copper thin films by chemical vapor deposition using a novel organic copper compound. More particularly, the present invention relates to a method for the production of highly pure copper thin films free from carbonaceous impurities.

2. Description of the Prior Art

Heretofore, various metal materials have been used as an interconnection material for integrated circuits in the field of electronics. Among them, aluminium has certain advantages, in that it has high electric conductivity, high adhesion to silica and silicon, and is easily used in vapor deposition, etching and pattern formation. However, aluminium is unsuitable for use in the fabrication of ULSI (ultra large scale integrated circuits) due to its low melting point, low electromigration resistance and strong tendency to corrode. Tungsten is interesting as a substitute for aluminium, because of its high electromigration resistance and high melting point. However, tungsten is also unsuitable for the fabrication of ULSI, since a large amount of heat is generated due to its high electric resistance if high current is used to increase the frequency of operation of a ULSI device.

Consequently, interest in this field has recently been focused on the use of copper as an interconnection material. Copper has low electric resistance and high electromigration resistance as well as high conductivity.

A method for producing a metal thin film by chemical vapor deposition, in particular, with an organometallic compound precursor, is of interest since the precursor in gaseous form can be conveniently and inexpensively decomposed into metallic copper and other components thereof, at lower energy to form a metal film on an appropriate surface.

Organic copper compounds containing a $\beta$-diketone, alkoxide or cyclopentadiene as a ligand have been Conventionally used as precursors for the vapor deposition of copper films. Most of these precursors, however, have failed to provide highly pure copper thin films because impurities are introduced into the films as a result of the thermal decomposition of the ligands during the vapor deposition. Also, a method is known wherein a $\beta$-diketonate compound containing fluorine-substituted $\beta$-diketones alone( U.S. Pat. No. 3,356,527) or in combination with a Lewis base (Chemical Materials, 1992, 4, 577, 788) as ligands is employed. However, the fluorine-containing ligands are very expensive and have a marked tendency to corrode equipment, such as reactors.

We, the inventors of the present invention, have conducted intensive studies on various ligands that can be thermally stable at the temperatures at which the precursor is reactive. As a result, we have discovered that an organic copper compound precursor having $\beta$-ketoester as a ligand can produce highly pure copper thin films without carbonaceous impurities, and completed the present invention.

SUMMARY OF THE INVENTION

The object of the present invention is, therefore, to provide a method for producing highly pure copper thin films by chemical vapor deposition using an organic copper compound as a precursor.

This and other objects of the invention can be achieved by using an organic copper compound precursor containing, as ligands, ketoesters alone or in combination with a Lewis base. The novel precursor according to the invention provides a highly pure copper thin film free from carbonaceous impurities resulting from the thermal decomposition of the ligands.

Further objects and advantages of the invention will become apparent through reading the remainder of the specification.

DETAILED DESCRIPTION OF THE INVENTION

According to the present invention, an organic copper compound containing, as ligands, ketoesters alone or in combination with a Lewis base is used as a precursor for copper deposition. The precursor is chemically deposited on a suitable substrate in the presence or the absence of hydrogen, to form a highly pure copper thin film on the substrate. The film thus formed is free from carbonaceous impurities since the organic ligands are not thermally decomposed during the deposition.

According to the invention, the organic copper compound precursor containing at least one ketoester ligand is reacted with hydrogen to be decomposed into metallic copper and the ligand components, as can be seen from the following reaction equations:

$$(\beta\text{-ketoester})_2\text{Cu} + \text{H}_2 \rightarrow \text{Cu} + 2\beta\text{-ketoester} \quad (1)$$

$$2(\beta\text{-ketoester})\text{CuL} + \text{H}_2 \rightarrow 2\text{Cu} + 2\beta\text{-ketoester} + 2\text{L} \quad (2)$$

wherein L represents a Lewis base.

Gas chromatography and mass spectrometry analysis showed that the resulting organic substances are a pure $\beta$-ketoester for Reaction (1), and a mixture of a $\beta$-ketoester and a Lewis base for Reaction (2).

In the absence of hydrogen, the precursor containing a ketoester and a Lewis base as ligands is decomposed into metallic copper, a copper(II) compound, and a Lewis base as shown in the following reaction equation:

$$2(\beta\text{-ketoester})\text{CuL} \rightarrow \text{Cu} + \text{Cu}(\beta\text{-ketoester})_2 + 2\text{L} \quad (3)$$

The organic copper(II) compound precursor used in equation(1) can be obtained by reacting a $\beta$-ketoester with a cupric sulfate or nitrate in the presence of a base, followed by recrystallization and sublimation of the resulting product.

Similarly, the organic copper(I) compound precursor used in equations(2) and (3) can be prepared by reacting a $\beta$-ketoester with a cuprous oxide or chloride in the presence of a Lewis base, followed by recrystallization and sublimation of the resulting product.

$\beta$-Ketoesters to be used in the present invention include compounds having a $C_{1-6}$ alkyl group in its ketone moiety and a $C_{1-6}$ alkyl group in its ester moiety, in which the alkyl group in either the ketone or the ester moiety is optionally substituted by methoxy or ethoxy group.

Typically, the $\beta$-ketoesters according to the invention include methylacetoacetate (METAC), ethylacetoacetate (ETAC), t-butylacetoacetate (BUTAC), benzylacetoacetate (BENZYAC), methoxyethylacetoacetate (METHETAC), ethylbenzoylacetate (ETBENZOAC), and the like.

Typical examples of the Lewis base include cyclooctadiene, 2-butyne, trimethylvinylsilane, trimethylphosphine, and the like.

The organic copper compound precursor obtained in the manner described above is decomposed in a chemical vapor deposition apparatus comprising a gas injector, a reactor and a ventilator to produce a copper thin film on a substrate.

The precursor which has been vaporized by heating in the gas injector is injected into the reactor together with or without preheated hydrogen gas and/or nitrogen or argon carrier gas. The amount of the precursor to be injected is controlled depending on the reacting temperature, the amount of the carrier gas to be used, etc. When the precursor reaches the substrate, it is vaporized and thermally decomposed on the substrate resulting in the formation of a pure copper thin film on the substrate. The unreacted precursor and decomposition products other than copper are collected in the liquid nitrogen trap via the ventilator.

Preferably, a silicon wafer or silica-coated silicon wafer is used as a substrate, but any substrates suitable for the CVD process may be used.

The substrate is maintained at a temperature that is sufficient to produce a copper film by reaction with the vaporous precursor, preferably at a temperature ranging from 100° C. to 350° C.

Similarly, the temperatures at which the precursor is to be heated can be varied in a wide range, generally up to 250° C., preferably from 20° C. to 150° C.

The reactor is maintained at 0.01 to 10 mmHg (1.33–1,333 $N/m^2$). The base pressure can be adjusted down to $10^{-7}$ mmHg ($133.3 \times 10^{-7}$ $N/m^2$) by means of a Balzer's rotary pump or a turbo pump as a vacuum pump.

The chemical vapor deposition process according to the invention can be carried out in the presence or the absence of hydrogen gas.

In the presence of hydrogen gas, both the copper(I) and copper(II) compounds can be used as a precursor. The copper precursor heated to 20° C. to 150° C. is injected with or without nitrogen carrier gas into the reactor, where it is mixed with hydrogen gas preheated to the same temperature. The reactor pressure is preferably maintained at 0.01 to 10 mmHg (1.33 to 1,333 $N/m^2$). The injected reaction gas is decomposed into copper and the organic ligand components on the substrate preheated to 100° C. to 350° C. The copper is thus coated on the substrate, while the ligands are discharged and collected in the liquid nitrogen trap.

Both gas chromatography and mass spectrometry analysis identify the substances collected in the liquid nitrogen trap to be either pure organic ligands or pure organic ligands and a Lewis base. No other substances are observed. This indicates that the copper precursor of the invention is decomposed in the presence of $H_2$ into copper and organic ligands which are stable without being further decomposed, so that a pure copper film free from carbonaceous impurities can be produced.

In the absence of $H_2$, only the copper(I) compound can be used as a copper precursor. The precursor heated to 20° C. to 150° C. is injected with or without nitrogen carrier gas into the reactor. The reactor is maintained at 0.01 to 10 mmHg (1.33–1,333 $N/m^2$). The injected reaction gas is decomposed into copper, a copper(II) compound, and a Lewis base. The latter two are produced by redistribution of the copper(I) compound precursor used on the substrate preheated to 100° C.–350° C. Copper is formed as a film on the substrate, and the copper(II) compound and the Lewis base are discharged and collected in the liquid nitrogen trap.

The deposited film was identified to be pure copper, in which no carbon or oxygen impurities are contained by Auger electron spectroscopy (AES) and X-ray diffraction. Also, scanning electron microscopy (SEM) and Tencor's stylus profilometry showed that the copper thin film is uniformly deposited in particle size and thickness. The resistance of the untreated (unheated) sample was determined to be 1.7 to 3.9 $\mu\Omega$cm. It is confirmed by using Alessi's 4-point probe that the copper film deposited according to the invention has the same resistance as that of a pure copper metal.

As described above, the thermal decomposition pattern according to the present invention can minimize the disadvantages caused by contamination of the copper film by carbon during the chemical vapor deposition thereof. The thermal decomposition pattern is characterized in that the organic ligands, i.e. the decomposition products of the precursor, are removed from the reactor in very stable state without being further decomposed. The deposition method of the present invention, therefore, is very useful for producing a highly pure copper thin film on an appropriate substrate. Also, the present invention provides the additional advantage that the copper film can be deposited on the substrate at a lower temperature as low as 250° C. using the precursor of the invention.

DESCRIPTION OF THE PREFERRED EMBODIMENTS

The present invention will be illustrated in greater detail by way of the following examples. The examples are presented for illustrative purpose only and should not be construed as limiting the invention, which is properly delineated in the claims.

EXAMPLE 1

HYDROREDUCTION(REACTION IN THE PRESENCE OF $H_2$)

A silicon wafer or a silica-coated silicon wafer was placed in a cold-wall reactor. Nitrogen was blown into the reactor. The substrate was heated to a temperature between 100° C. and 350° C., and the pressure of the reactor was reduced to $10^{-7}$ mmHg ($133.3 \times 10^{-7}$ $N/m^2$) by pumping for 30 min. 1 g of an organic copper(I) or (II) compound as listed in Table 1 was heated to a temperature between 40° C. and 70° C., and the vapor produced was injected into the reactor together with hydrogen. The gas conduit and the reactor wall were maintained at 60° C. to 90° C., and the reactor at 0.1 mmHg (13.3 $N/m^2$). However, the substrate was maintained at 100° C. to 350° C. Alternatively, when the vaporous precursor was injected into the reactor by an argon carder gas, the reactor was maintained at 10 mmHg (1,333 $N/m^2$). The reaction by-products were collected from the reactor by the liquid nitrogen trap. These by-products were identified, by gas chromatography and mass spectrometry, to be organic ligands in the case of a copper(II) precursor, and to be an organic ligand and a Lewis base in the case of a copper(I) precursor. No other substances were observed.

Table 1 below shows the physical characteristics of the copper film which are obtained after 2 hour reaction with the various precursors according to the invention.

TABLE I

| * Copper Precursor | Specific Resistance ($\mu\Omega$cm) | Auger Analysis (%) | | |
|---|---|---|---|---|
| | | Cu | C | O |
| Cu(METAC)$_2$ | 2.9–3.5 | 98 | <1 | — |
| Cu(ETAC)$_2$ | 1.7–2.9 | >99 | — | — |
| Cu(BUTAC)$_2$ | 1.9–3.3 | 99 | — | — |
| Cu(BENZYAC)$_2$ | 2.0–3.3 | >99 | — | — |
| Cu(METHETAC)$_2$ | 1.7–2.5 | >99 | — | — |
| Cu(ETBENZOAC)$_2$ | 2.0–3.3 | 99 | — | — |
| Cu(ETAC) (TMVS) | 1.7–2.2 | >99 | — | — |
| Cu(METHETAC) (PMe$_3$) | 1.8–2.5 | >99 | — | — |

* METAC = methylacetoacetate
ETAC = ethylacetoacetate
BUTAC = t-butylacetoacetate
BENZYAC = benzylacetoacetate
METHETAC = methoxyethylacetoacetate
ETBENZOAC = ethylbenzoylacetate
TMVS = trimethylvinylsilane (a Lewis base)
PMe$_3$ = trimethylphosphine (a Lewis base)

EXAMPLE 2

REDISTRIBUTION REACTION IN THE ABSENCE OF H$_2$

In the same manner as described in Example 1, a silicon wafer was placed in a cold-wall reactor. After pumping the chamber reactor for 30 min down to $10^{-7}$ mmHg ($133.3 \times 10^{-7}$ N/m$_2$), 1 g of a copper(I) compound as listed in Table II was heated to a temperature between 30° C. and 50° C., and the gas phase was injected into the reactor. The gas conduit and the reactor wall were maintained at 50° C. to 70° C., and the reactor at 0.1 mmHg (13.3 N/m$_2$). The substrate was maintained at 100° C. to 300° C. Alternatively, when the vaporous precursor was injected into the reactor by an argon carrier gas, the pressure was maintained at 10 mmHg (1,333 N/m$_2$). The reaction by-products were collected by a liquid nitrogen trap. The by-products were identified, by gas chromatography and mass spectrometry, to be a Lewis base and copper(II) compounds resulting from the redistribution of the copper(I) compound precursor used.

Table II shows the physical characteristics of the copper films which are obtained after 2 hour reaction with the various precursors according to the invention.

TABLE II

| * Copper Precursor | Specific Resistance ($\mu\Omega$cm) | Auger Analysis (%) | | |
|---|---|---|---|---|
| | | Cu | C | O |
| Cu(METHETAC)(TMVS) | 1.7–2.5 | >99 | — | — |
| Cu(ETAC) (PMe$_3$) | 1.8–3.0 | >99 | — | — |
| Cu(METHETAC)(2-butyne) | 1.8–2.7 | >99 | — | — |
| Cu(ETAC)(1,5-COD) | 1.9–2.5 | >99 | — | — |

* ETAC = ethylacetoacetate
METHETAC = methoxyethylacetoacetate
TMVS = trimethylvinylsilane (a Lewis base)
PMe$_3$ = trimethylphosphine (a Lewis base)
1,5-COD = 1,5-cyclooctadiene (a Lewis base)

What is claimed is:

1. A method for the production of copper thin films on a substrate with an organic copper compound precursor by chemical vapor deposition, comprising employing, as the precursor, a copper-$\beta$-ketoester compound containing $\beta$-ketoesters alone or in combination with a Lewis base as ligands, in the presence or the absence of hydrogen.

2. The method according to claim 1, wherein said copper-$\beta$-ketoester compound has two $\beta$-ketoester ligands having a C$_{1-6}$ alkyl group in its ketone moiety and a C$_{1-6}$ alkyl group in its ester moiety, said alkyl groups being optionally substituted by methoxy or ethoxy group, and said ligands being coordinated with a copper(II) cation.

3. The method according to claim 2, wherein said $\beta$-ketoester is selected from the group consisting of methylacetoacetate (METAC), ethylacetoacetate (ETAC), t-butylacetoacetate (BUTAC), benzylacetoacetate (BENZYAC), methoxyethylacetoacetate (METHETAC), and ethylbenzoylacetate (ETBENZOAC).

4. The method according to claim 1, wherein said copper-$\beta$-ketoester compound has a $\beta$-ketoester ligand having a C$_{1-6}$ alkyl group in its ketone moiety and C$_{1-6}$ alkyl group in its ester moiety, and a Lewis base ligand, said alkyl groups being optionally, substituted by methoxy or ethoxy group, and said ligands being coordinated with a copper(I) cation.

5. The method according to claim 4, wherein said $\beta$-ketoester is selected from the group consisting of methylacetoacetate (METAC), ethylacetoacetate (ETAC), t-butylacetoacetate (BUTAC), benzylacetoacetate (BENZYAC), methoxyethylacetoacetate (METHETAC) and ethylbenzoylacetate (ETBENZOAC), and said Lewis base is selected from the group consisting of trimethylvinylsilane, trimethylphosphine, 2-butyne, and 1,5-cyclooctadiene.

6. The method according to claim 1, wherein said copper-$\beta$-ketoester compound containing a $\beta$-ketoester and a Lewis base as ligands is employed in the absence of hydrogen.

* * * * *